(12) United States Patent
de Jong

(10) Patent No.: US 7,429,867 B1
(45) Date of Patent: Sep. 30, 2008

(54) CIRCUIT FOR AND METHOD OF DETECTING A DEFECT IN A COMPONENT FORMED IN A SUBSTRATE OF AN INTEGRATED CIRCUIT

(75) Inventor: Jan L. de Jong, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 437 days.

(21) Appl. No.: 11/032,375

(22) Filed: Jan. 10, 2005

(51) Int. Cl.
*G01R 31/28* (2006.01)
*G01R 31/26* (2006.01)

(52) U.S. Cl. .................. 324/763; 324/525; 324/537; 324/719; 324/765

(58) Field of Classification Search ......... 324/754–765, 324/527–528
See application file for complete search history.

(56) References Cited

U.S. PATENT DOCUMENTS

| | | | | |
|---|---|---|---|---|
| 3,723,864 A | * | 3/1973 | Ricard | 324/525 |
| 6,281,696 B1 | | 8/2001 | Voogel | |
| 6,509,739 B1 | * | 1/2003 | Voogel et al. | 324/525 |
| 6,621,289 B1 | | 9/2003 | Voogel | |
| 6,727,710 B1 | * | 4/2004 | de Jong et al. | 324/719 |
| 6,765,404 B2 | * | 7/2004 | Gilliam | 324/765 |
| 7,227,364 B1 | * | 6/2007 | Fan et al. | 324/528 |
| 2006/0022693 A1 | * | 2/2006 | Bazan et al. | 324/765 |

* cited by examiner

*Primary Examiner*—Ha Nguyen
*Assistant Examiner*—Emily Y Chan
(74) *Attorney, Agent, or Firm*—John J. King

(57) ABSTRACT

Various embodiments of the present invention describe circuits for and methods of detecting a defect in a component formed in a substrate of an integrated circuit. According to one embodiment, a circuit comprises a plurality of components formed in a substrate and coupled in series by a plurality of signal paths extending from a first end to a second end. An input signal coupled to the first end of the first signal path is detected a signal detector coupled to a second end of the first signal path to determine whether there is a defect in a component formed in the substrate. Switching networks at the inputs and the outputs of the plurality signal paths enable determining a particular signal path that had a defect. Alternate embodiments describe circuits for determining the location of a defective component in a signal path. Various methods of detecting defective components are also described.

21 Claims, 9 Drawing Sheets

-- PRIOR ART --

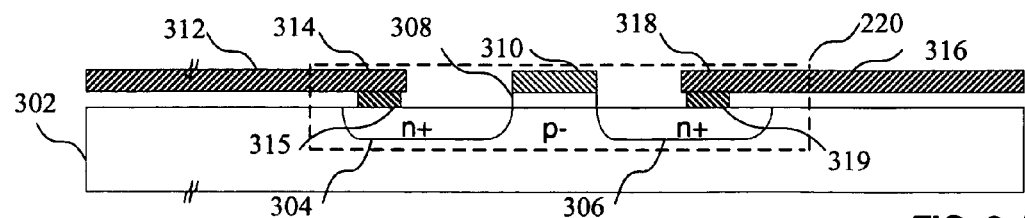
FIG. 3-A
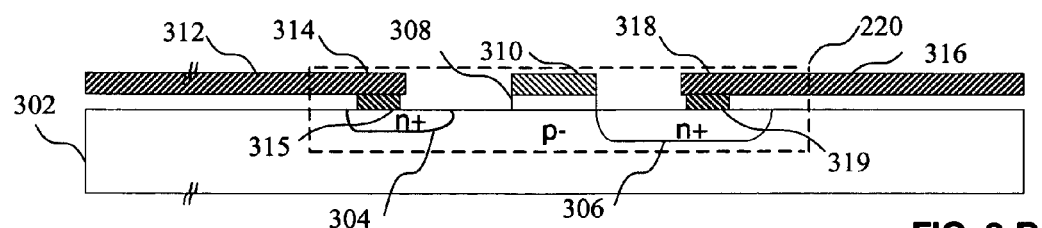
FIG. 3-B
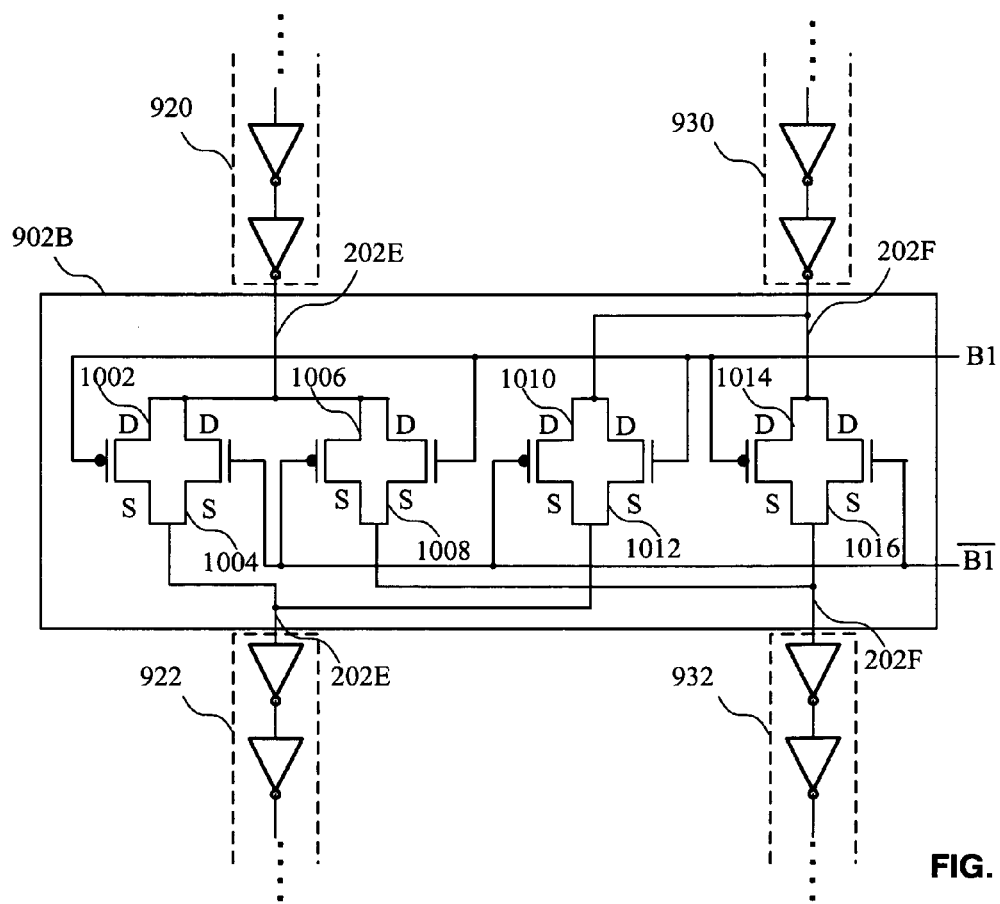
FIG. 10

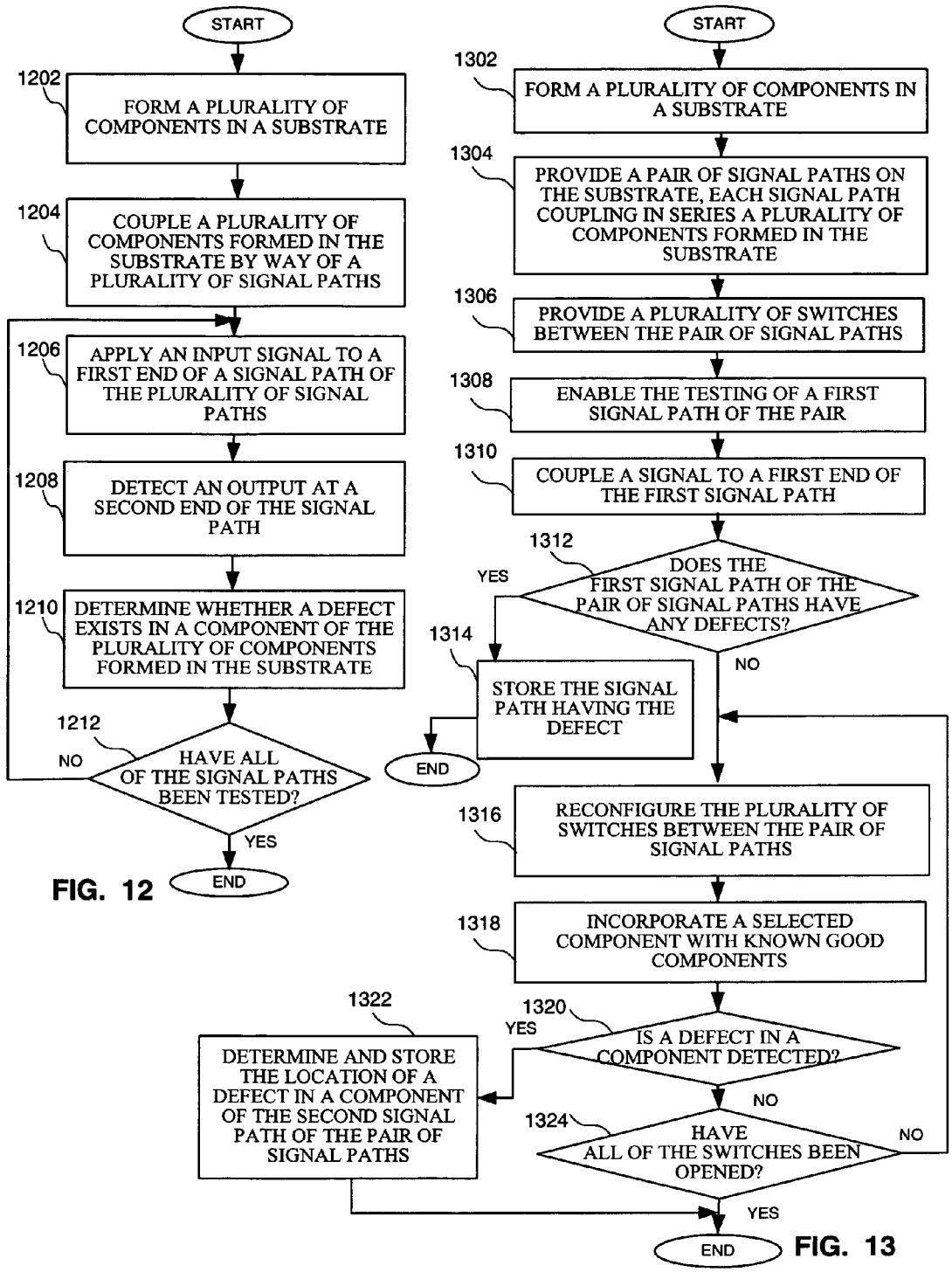

CIRCUIT FOR AND METHOD OF DETECTING A DEFECT IN A COMPONENT FORMED IN A SUBSTRATE OF AN INTEGRATED CIRCUIT

FIELD OF THE INVENTION

The present invention is related to an integrated circuit, and in particular, a circuit for and a method of detecting a defect in a component formed in a substrate of an integrated circuit.

BACKGROUND OF THE INVENTION

In manufacturing semiconductor devices, it is important that the devices are free of defects at the time of production, and reliable throughout their use. When defects are found in a die on a wafer, the percentage of usable die decreases, and the profitability of the manufacturer is impacted. More importantly, when a completed semiconductor device fails after it has been installed in a finished product, such as a consumer electronics product, the failure of the semiconductor device could cause the entire product to fail. That is, the failure of a single semiconductor device could render an entire consumer electronics device unusable. Accordingly, it is important that manufacturers of semiconductor devices identify and eliminate defects whenever possible.

When a semiconductor device is manufactured, a wafer receives a number of doping, layering, and patterning steps. Each of these steps must meet exacting physical requirements. For example, each layer is patterned to add or remove selected portions to form circuit features that will eventually make up a complete integrated circuit. The patterning process, such as photolithography, defines the dimensions of the circuit features. Problems encountered in the formation of any one layer could render an entire die unusable. Defective semiconductor devices are therefore tested in order to identify defective layers.

Once detected, these defective layers are analyzed in a process called failure analysis. During failure analysis, valuable information regarding problems with fabrication materials, process recipes, ambient air, personnel, process machines, and process materials could be discovered. Therefore, the detection of defects in a layer of an integrated circuit is critical to high yields and process control. When a new manufacturing process is being developed, a test structure for identifying defects in a layer could be specifically incorporated in the circuit for testing the new manufacturing process.

Identifying a specific defect in a defective layer requires an inspection of the structure by the user. Visual inspection is a common method of determining the failure in the integrated circuit. However, a visual inspection is a tedious process, requiring considerable time of an experienced engineer. Further, not all visual defects result in electrical failures. Therefore, to more closely analyze the visual defects, the engineer must typically perform both optical and scanning electron microscope (SEM) examinations. Also, many defects are not visible by initial inspection, thereby making the identification of the defects with a SEM difficult.

Accordingly, circuits have been developed to detect defective conductors. One example of a conventional circuit 100 for detecting a defective conductor is shown is shown in FIG. 1. In particular, a plurality of conductors 102A-102F comprise metal layers formed on the substrate of the integrated circuit. The conductors 102A-102F could comprise test conductors formed on the substrate in order to detect open circuits in conductors of interconnection layers. Although the conductors are formed on the surface of the substrate, some portions 103 of the conductors could extend into a diffusion region of the substrate, where the diffusion region provides a portion of the conductor. For example, a portion of the conductor may terminate at a diffusion region, and the conductor continues from another point of the diffusion region.

The circuit 100 of FIG. 1 enables the detection of the location of the defective conductor by providing a switching network to opposite ends of the conductors 102A-102F. In particular, a first switching network 104A comprising a plurality transistors 106A-106F is coupled to a first end of the conductors. The switching network 104A couples an input signal in_v to a conductor by way of one of the transistors. A second switching network 104B at a second end of the conductors enables the selection of a conductor. The output out_v of the second switching network 104B is coupled to a detection circuit 105, which outputs an output test signal indicating whether a conductor is defective.

Similarly, another switching network comprises a third switching network 110A having a plurality of transistors 112A-112F and a fourth switching network 110B having a plurality of transistors 114A-114F. A second input signal in_h is coupled from the third switching network to the fourth switching network by way of a second plurality of conductors 116A-116F. The output out_h of the fourth switching network 110B is also coupled to a detection circuit 118, which indicates whether a horizontal conductor is defective. Additional information related to conventional circuits for detecting defects in conductors formed on the substrate could be found in U.S. Pat. No. 6,509,739, issued to Voogel et al. on Jan. 21, 2003.

However, a defect could exist in a component formed in a substrate of an integrated circuit, such as a defect in a transistor. While significant efforts have been made to identify defective layers of an integrated circuit, conventional methods fail to detect a defect in a component formed in a substrate, and in particular identify the location of a defective component after the steps used to form an integrated circuit. Accordingly, there is a need for a circuit for and method of detecting a defect in a component formed in a substrate of an integrated circuit.

SUMMARY OF THE INVENTION

Various embodiments of the present invention describe circuits for and methods of detecting a defect in a component formed in a substrate of an integrated circuit. According to one embodiment, a circuit comprises a plurality of components formed in a substrate and coupled in series by a plurality of conductor segments. An input signal coupled to a first end of a first signal path is detected by a signal detector coupled to a second end of the first signal path to determine whether there is a defect in a component formed in the substrate. Switching networks at the inputs and the outputs of the plurality of signal paths enable determining a particular signal path having a defect.

According to an alternate embodiment of the present invention, a circuit for detecting the location of a defect in a signal path having a plurality of components formed in a substrate of an integrated circuit is described. In particular, the circuit comprises a first signal path coupling in series a first plurality of components formed in the substrate. A second signal path, adjacent to the first signal path, also couples in series a second plurality of components formed in the substrate. A plurality of switches between the first signal path and the second signal path enables determining the location of the defect in one of the components. According to various embodiments, the plurality of switches alters a path from a first end of the first signal path to a detection circuit by way of both the first and the second signal paths.

According to another alternate embodiment, a circuit for detecting a defect in a component formed in a substrate could be employed in a matrix for determining the location of the defect at some location of the matrix. The circuit comprises a first plurality of signal paths extending in a first direction, wherein each signal path couples a plurality of components formed in the substrate in series, and a first detection circuit coupled to the first plurality of signal paths. Similarly, a second plurality of signal paths extends in a second direction, wherein each signal path of the second plurality of signal paths couples in series a plurality of components formed in the substrate. A second detection circuit is also coupled to the second plurality of signal paths. Circuits for interleaving conductors and signal paths for detecting open circuits in both (i) conductors formed on the substrate and (ii) signal paths coupling components formed in the substrate are also disclosed. Various methods for forming and implementing the functions of the circuits are also disclosed.

BRIEF DESCRIPTION OF THE DRAWINGS

FIG. 3 is a cross-sectional view of a portion of a signal path taken at lines 3-3 of FIG. 2 according to an embodiment of the present invention;

FIG. 10 is a circuit diagram showing a switching element within and between two signal paths of FIG. 9 according to an embodiment of the present invention;

FIG. 12 is a flow chart showing a method of detecting a defect in a component of a signal path coupling a plurality of components formed in a substrate according to an embodiment of the present invention;

FIG. 13 is a flow chart showing a method of detecting the location of a defect in a signal path coupling a plurality of components formed in a substrate according to an embodiment of the present invention.

DETAILED DESCRIPTION OF THE DRAWINGS

Figure 1:
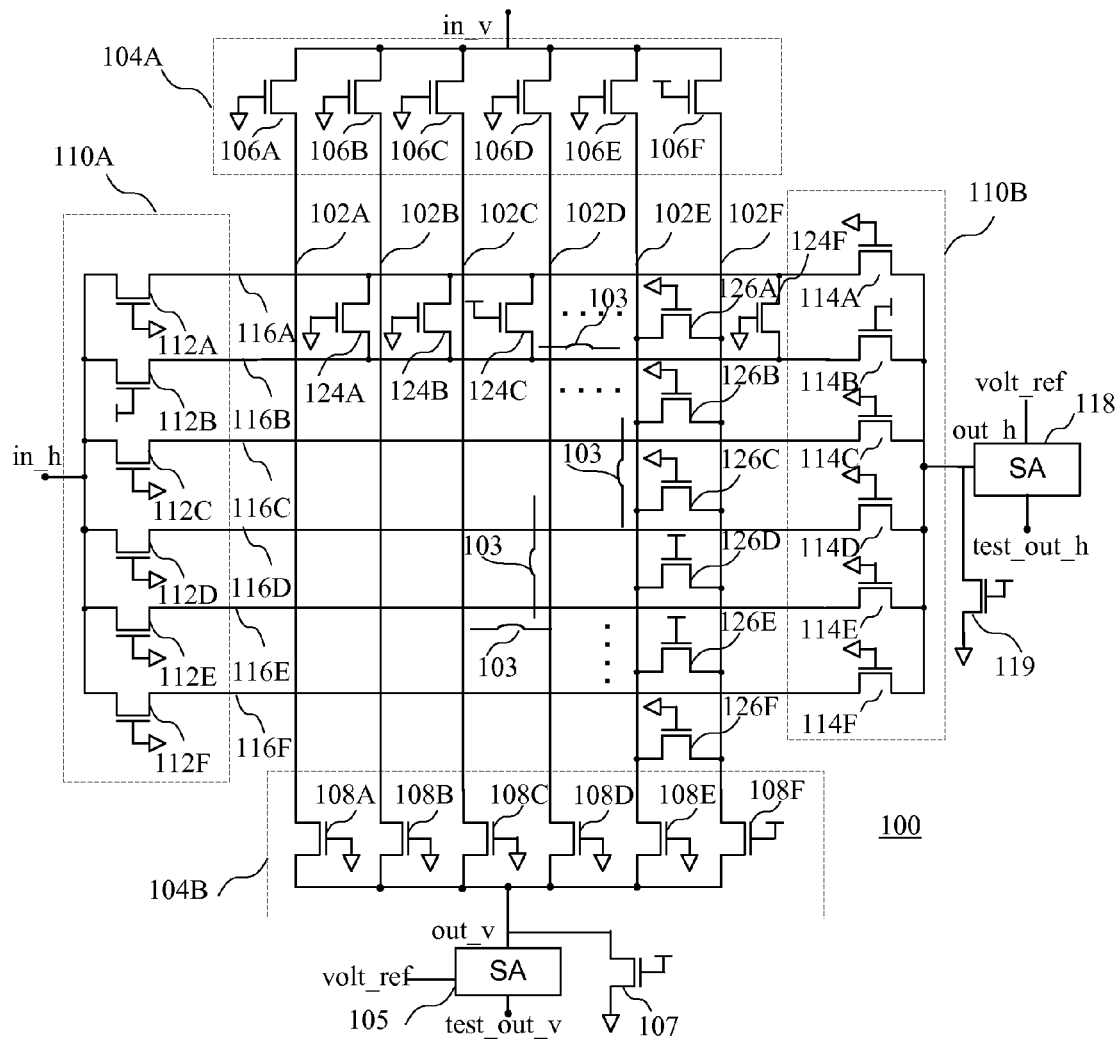
FIG. 1 is a circuit diagram of a conventional circuit for detecting a defective conductor in an integrated circuit.
Figure 2:
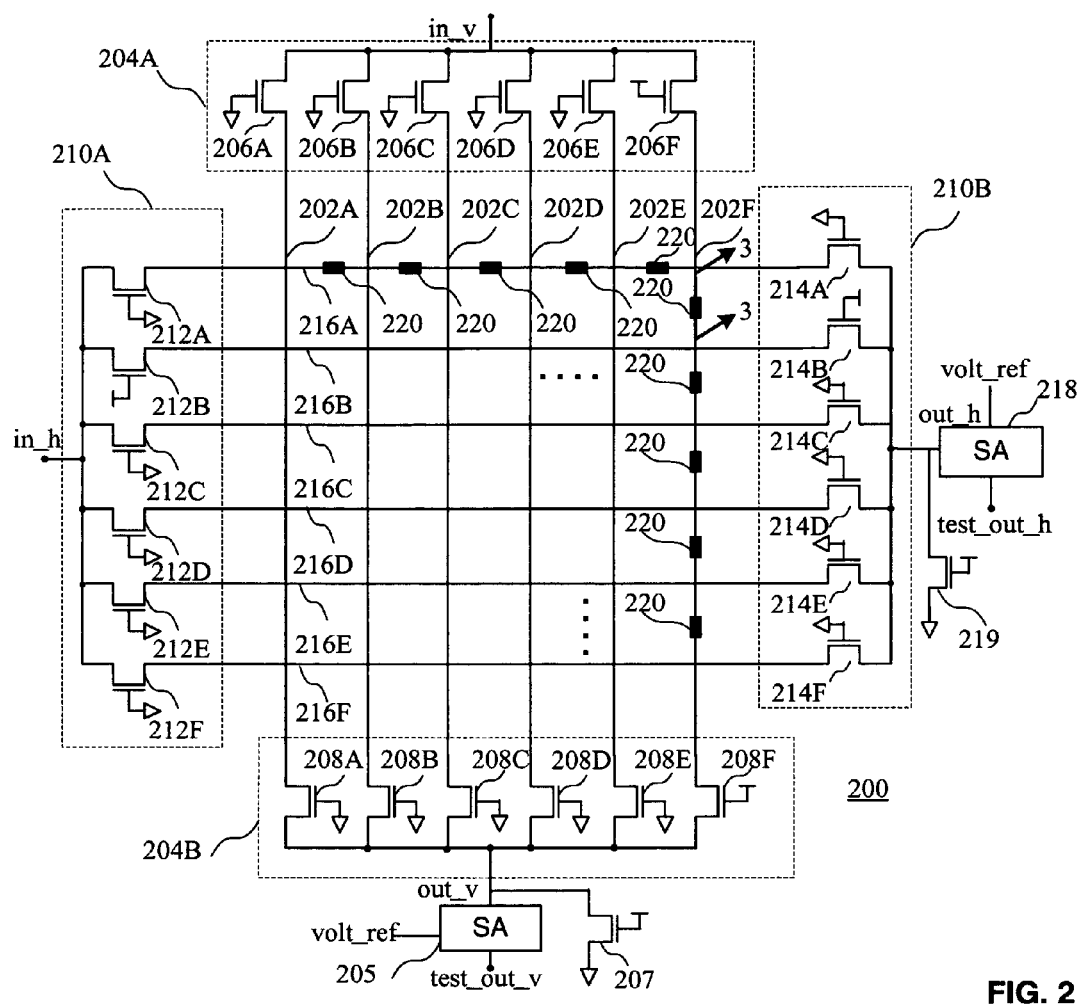
FIG. 2 is a circuit diagram of a circuit for detecting a defective component formed in a substrate of an integrated circuit according to an embodiment of the present invention.

Turning first to FIG. 2, a circuit diagram of a circuit 200 for detecting a defective component formed in a substrate of an integrated circuit according to an embodiment of the present invention is shown. The circuit has a plurality of components and signal paths. The signal paths comprise components formed in the substrate, as will be described in more detail in reference to FIG. 3. The signal paths are preferably interleaved among a plurality of conductors formed on the substrate. For example, the conductors 202A-202E could comprise test conductors formed on the substrate in order to detect open circuits in conductors of interconnection layers. An example of a circuit for detecting defects in conductors formed on the substrate could be found in U.S. Pat. No. 6,509,739, issued to Voogel et al. on Jan. 21, 2003, the entire application of which is incorporated herein by reference.

The circuit 200 of FIG. 2 also enables the detection of a component 220 in a signal path 202F that is defective by providing a switching network to opposite ends of the conductors 202A-202E and signal path 202F. In particular, a first switching network 204A, comprising a plurality of switches, such as transistors 206A-206F, is coupled to a first end of the conductors. The switching network 204A couples an input signal in_v to a conductor or the signal path 202F by way of one of the switches. A second switching network 204B is coupled to a second end of the conductors. A plurality of switches, such as transistors 208A-208F, also enables the selection of a conductor or the signal path 202F. According to the embodiment of FIG. 2, corresponding switches for a given line are selected to detect a signal at a detection circuit 205. As shown by way of example in FIG. 2, signal path 202F is selected by switching network 204A and 204B. Although a single detection circuit is shown, it is contemplated that a separate detection circuit could be employed for each conductor or signal path.

The output out_v of the second switching network 204B is coupled to the detection circuit 205. The detection circuit 205 could be, for example, a sense amplifier receiving a reference voltage volt_ref and generating an output test signal test_out_v. The output test signal indicates whether a component 220 in the selected signal path is defective. For example, a high input in_v coupled to the switching network 204A would be detected as a high output at the detection circuit 205 if there are no defective components 220. A weak pull-down transistor 207 is preferably coupled to the output of the second switching network 204B to maintain the voltage at the second end of the conductors low unless a high signal (coupled to the input of the first switching network 204A) is detected by the detection circuit. Accordingly, if there is an open circuit in a conductor or the signal path, the weak pull-down transistor 207 will maintain the input to the detection circuit 205. If the conductor does not have a defect, the high input signal, which will be a stronger signal than the voltage from the weak pull-down transistor, will be detected by the detection circuit. However, in detecting a defective component in a signal path, a toggled signal is detected by the signal detector, eliminating the need for the weak pull-down transistor.

Similarly, another switching network comprises a third switching network 210A having a plurality of switches such as transistors 212A-212F and a fourth switching network 210B having a plurality of switches such as transistors 214A-214F. A second input signal in_h is coupled from the third switching network to the fourth switching network by way of a second plurality of conductors 216B-216F and signal path 216A. The output out_h of the fourth switching network 210B is also coupled to a detection circuit 218. Finally, another output test signal test_out_h indicates whether a component 220 in one of the horizontal signal paths is defective. A weak pull-down transistor 219 is preferably coupled to the output of the second switching network 210B to maintain the voltage at the second end of the horizontal conductors low unless a high input signal coupled to the input of the first switching network 210A is received by the detection circuit.

Although five horizontal and five vertical conductors are shown with a signal path, any number of conductors could be employed with a signal path. Similarly, any number of components 220 could be employed in a given signal path, and a signal path having components formed in a substrate could be positioned with other conductors at any interval. For example, a signal path having components coupled in series could be positioned at every thirty-second conductor. Alternatively, the circuit could include only signal paths. As described above, the circuit 200 of FIG. 2 could cover the entire area of the wafer 102, a single die 104 of the wafer, between die on a wafer, or at one or more sections of a die.

Turning now to FIG. 3, a cross-sectional view of a portion of a signal path taken at lines 3-3 of FIG. 2 according to an embodiment of the present invention is shown. In particular, component 220, which is formed in the substrate 302, could comprise a transistor having a first diffusion region 304 and a second diffusion region 306, as is shown in FIG. 3-A. The substrate 302 could be a p-type diffusion region, while the first and second diffusion regions 302 and 304 could be n-type diffusion regions. An insulating layer 308 and a polysilicon layer 310 form a gate of the transistor, as is well known in the art. A signal path, such as one of the signal paths 202F or 216A of FIG. 2, comprises a first conductor segment 312 extending to a contact portion 314 coupled to a contact 315. The first conductor segment 312 could be in any layer of a plurality of conductive layers of the integrated circuit, and contact 315 could extend through any number of layers to form a connection between contact portion 314 and the diffusion region 304 of the substrate. Similarly, the signal path comprises a second conductor segment 316 extending to a contact portion 318 coupled to a contact 319. The second conductor segment 316 could also be in any layer of the integrated circuit, and contact 319 could extend through various layers to form a connection between contact portion 318 and the diffusion region 306. A defective component could be detected, as shown for example in FIG. 3-B, where the diffusion region was not formed properly, and the signal would not be detected at the end of the signal path. As a result, the transistor does not function properly. Although a single transistor is shown as a component formed in the substrate in FIG. 3 by way of example, a more detailed circuit could employed. A component 220 could be any active device comprising a transistor or group of transistors.

Figure 4:
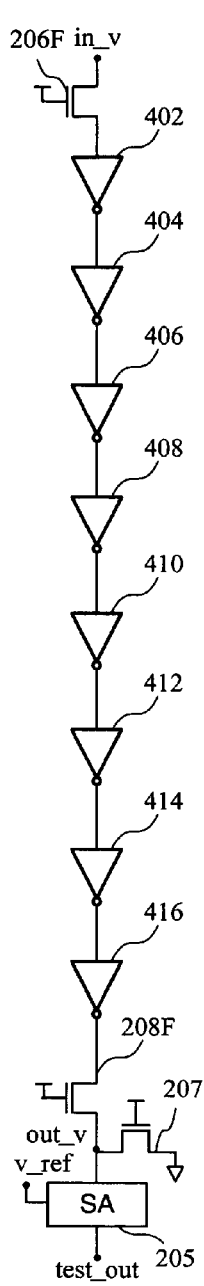
FIG. 4 is a circuit diagram of a signal path having components formed in a substrate of an integrated circuit according to an embodiment of the present invention.
Figure 5:
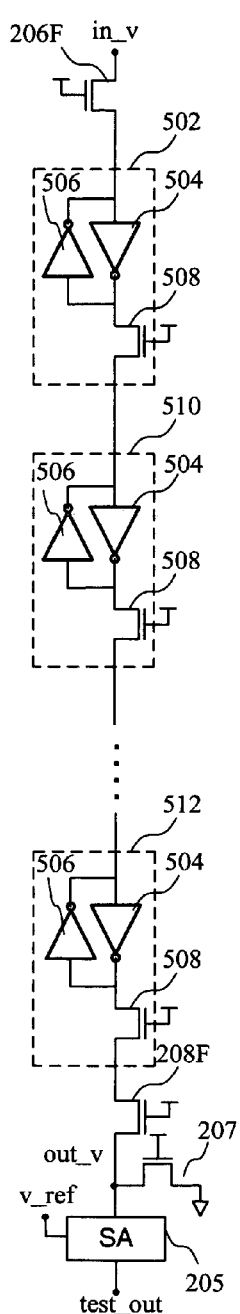
FIG. 5 is a circuit diagram of a signal path having components formed in a substrate of an integrated circuit according to an alternate embodiment of the present invention.

Turning now to FIG. 4, a circuit diagram of a signal path having components formed in a substrate of an integrated circuit is shown. A plurality of inverters formed in the substrate is coupled between transistors 206F and 208F of signal path 202F. Alternatively, a latch 502, comprising a pair of inverters 504 and 506 and transistor 508 formed in the substrate, could be coupled between the transistors 206F and 208F, as shown for example in FIG. 5. By employing latches, it is also possible to increase the sensitivity of the circuit. Further, because the latches are similar in construction to memory cells, the latches provide a good indication that the cells of a memory element would function properly. While examples of components formed in the substrate are shown in FIGS. 4 and 5, it should be understood that other components or circuits could be employed in accordance with the present invention.

Figure 6:
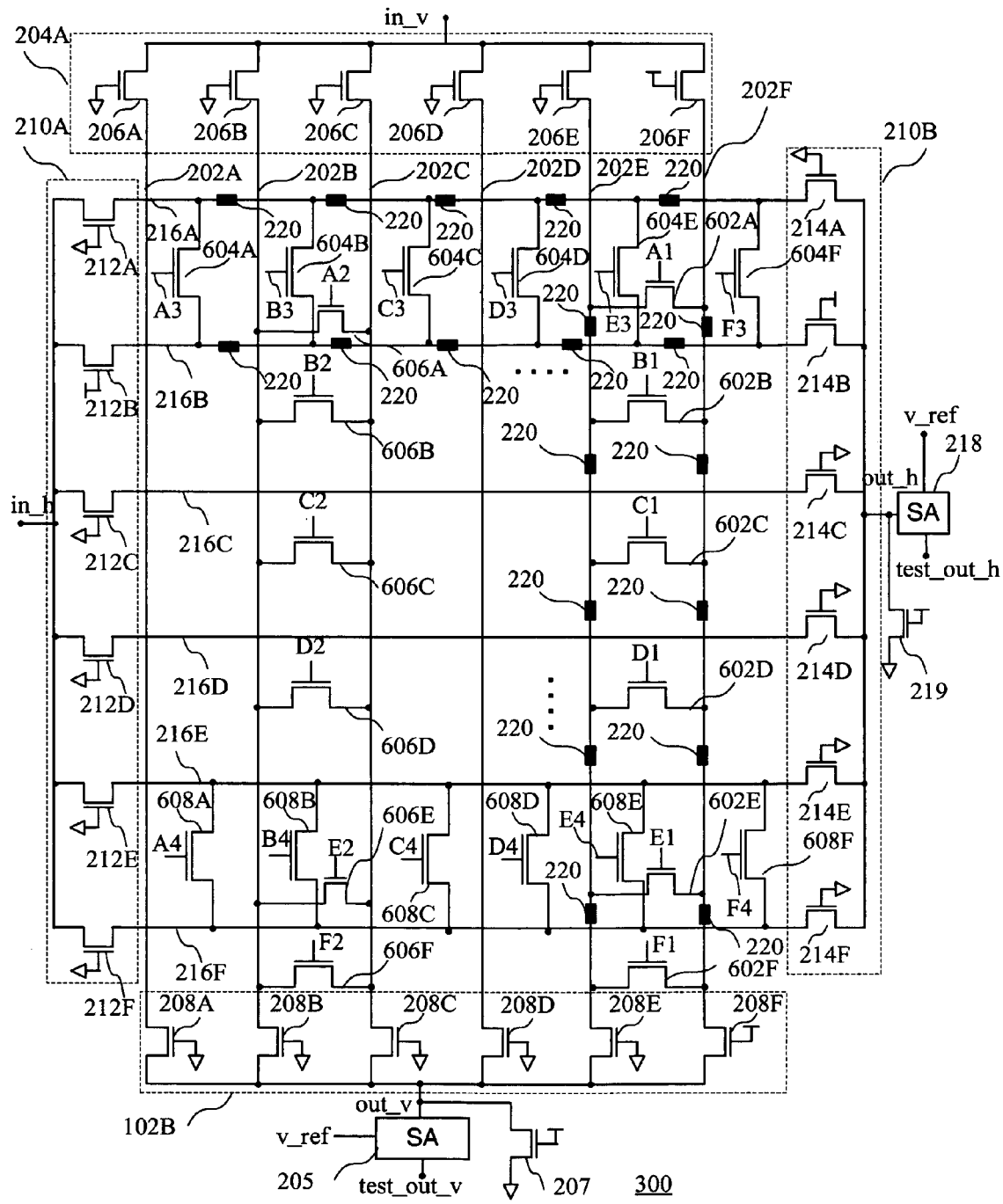
FIG. 6 is a circuit diagram of a circuit for detecting the location of a defective component formed in a substrate of an integrated circuit according to an embodiment of the present invention.

Turning now to FIG. 6, a circuit diagram of a circuit for detecting the location of a defective component formed in a substrate of an integrated circuit is shown. As can be seen, pairs of signal paths in each direction are coupled by coupling elements. That is, transistors 602A-602F are used to couple the two adjacent signal paths 202E and 202F. Similarly, transistors 604A-604F couple the pair of signal paths 216A and 216B. As will be described in more detail in reference to FIGS. 7 and 8, the transistors are selectively switched to determine the location of a defective component formed in the substrate. The circuit of FIG. 6 also includes transistors 606A-606F coupled between the pair of vertical conductors 202B and 202C (i.e. not having components 220), and transistors 608A-608F coupled between the pair of horizontal conductors 216E and 216F, which also do not have components 220. The transistors could be used to determine the location of an open circuit in a conductor formed on the substrate, as set forth in U.S. Pat. No. 6,509,739.

One beneficial application of the present invention is in detecting defects in memory elements of a memory device. For example, detecting a defective memory element in a 16 megabit memory comprises testing each of the 16 million memory elements of the 4000 rows and 4000 columns of memory elements. That is, 16 million test must be performed to identify an individual defect. However, by employing the circuit of FIG. 6, a defective row or defective column could easily be identified. Accordingly, only 8000 tests must be performed to identify defective rows or columns. Individual defects could then be identified within the defective rows or columns, thereby significantly reducing the time to determine defects in an array of memory cells.

Figure 7:
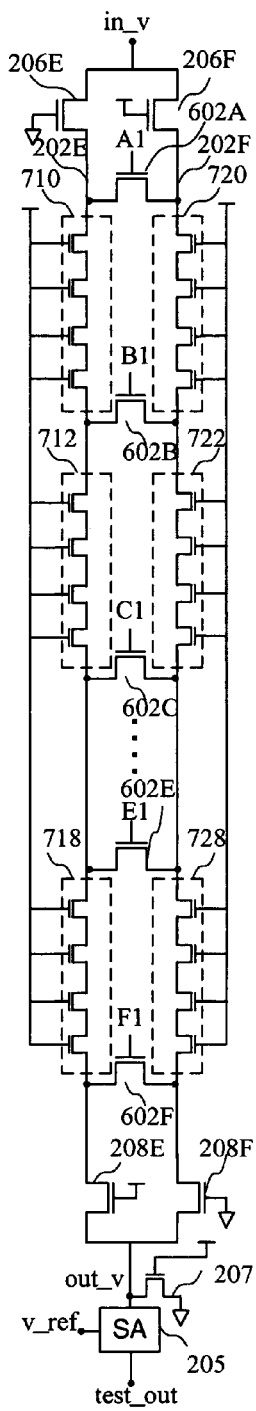
FIG. 7 is a circuit diagram of a pair of signal paths having components formed in a substrate of an integrated circuit and enabling the detection of the location of a defective component according to an embodiment of the present invention.

Turning now to FIG. 7, a circuit diagram of a pair of signal paths having components formed in a substrate of an integrated circuit enabling the detection of the location of a defective component is shown. The pair of signal paths 202E and 202F is coupled by transistors 602A-602F. The components, formed in the substrate and coupled in series by the conductor segments of the signal paths, comprise a series of transistors which are turned on. In particular, signal path 202E comprises components 710-718, while signal path 202F comprises components 720-728. Although four transistors are coupled in series in each of the components, any number of transistors, including a single transistor, could be employed between the transistors 602 coupling the pair of signal paths. Also, any number of transistors 602 coupling the pair of signal paths could be used. As will be described in reference to FIG. 8, the inputs A1-F1 to the transistors 602A-602F which couple the signal paths are selectively switched to detect the location of a defective component (i.e. a defective transistor in the embodiment of FIG. 7).

Figure 8A:
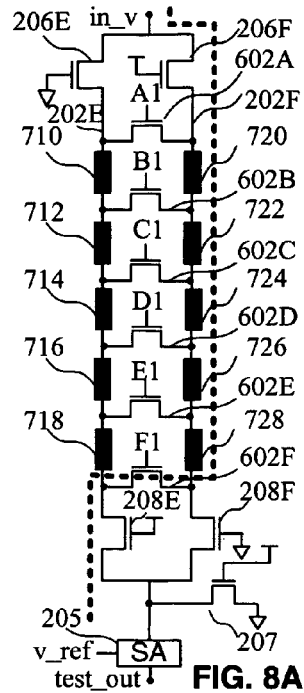
FIGS. 8A-F have a switching sequence showing the detection of a location of a defective component formed in a substrate by employing the circuit of FIG. 7 according to an embodiment of the present invention.
Figure 8B:
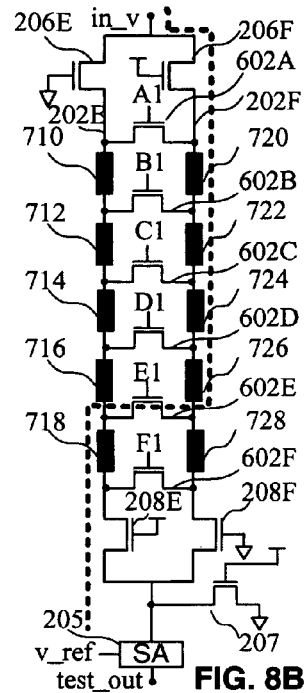
Figure 8C:
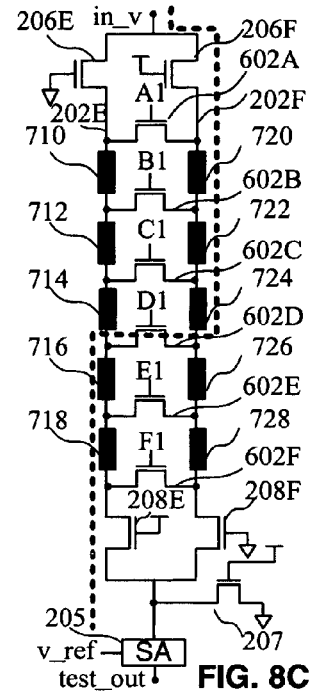
Figure 8D:
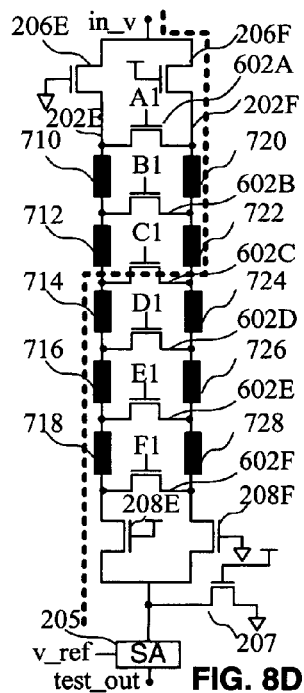
Figure 8E:
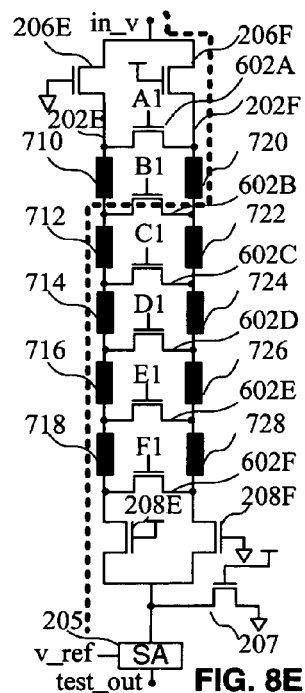
Figure 8F:
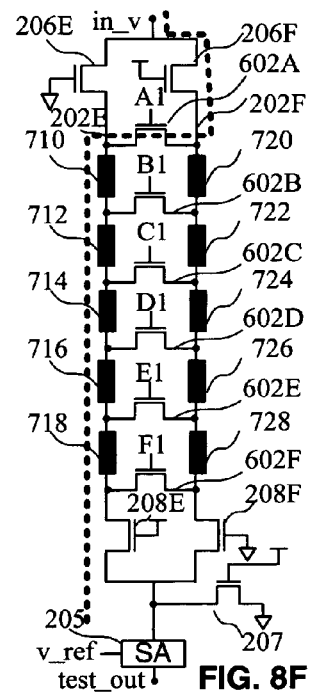

Turning now to FIGS. 8A-F, a switching sequence shows the detection of a location of a defective component formed in a substrate by employing the circuit of FIG. 7. In particular, the transistors for selecting a signal path are set to couple an input signal through all of the components of a first signal path, signal path 202F for example, of the pair of signal paths to determine whether there are any defects in the first signal path, as shown in FIG. 8A. Accordingly, transistor 206F and 208E are turned on, while transistor 206E and 208F are turned off. Initially, all of the transistors coupling the pair of signal paths are turned off, except transistor 602F, which is turned on to provide a path to transistor 208E. It should be noted that an initial test could be performed on all of the signal paths having components formed in the substrate to identify any components having a defect. Only those signal paths having a defect would then need to be tested to identify the location of a defect.

After determining that one of the signal paths does not have a defective component, transistor 602E is then turned on, and transistor 602F is turned off to alter the path from the input to the detection circuit to include component 718. If the detector 205 detects the correct signal, it is determined that component 718 is not the defective component, but rather some other component is defective. As can be seen in the remaining FIGS. 8B-8F, each of the transistors 602A-602D are sequentially turned on (with the remaining transistors coupling the signal paths turned off) to couple another one of the components 710-716 in the path from the input to the detection circuit to determine whether the new component is the defective component. The switching of the transistors continues until the defective component is identified. The switching of the transistors essentially functions to provide a component as a circuit under test.

Figure 9:
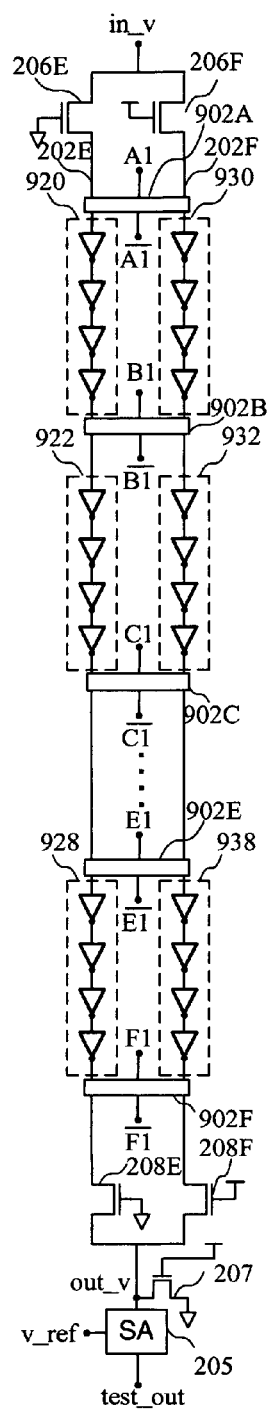
FIG. 9 is a circuit diagram of a pair of signal paths having components formed in a substrate of an integrated circuit and enabling the detection of the location of a defective component according to an alternate embodiment of the present invention.

Turning now to FIG. 9, a circuit diagram of a pair of signal paths having components formed in a substrate of an integrated circuit according to an alternate embodiment of the invention is shown. As shown in FIG. 9, coupling elements 902A-902F, an example of which will be described in more detail in reference to FIG. 10, couple the pair of signal paths 202E and 202F. The components in the embodiment of FIG. 9 comprise invertors coupled in series, with a first plurality of components 920-928 coupled in series with signal path 202E and a second plurality of components 930-938 coupled in series with signal path 202F. Each component preferably comprises an even number of invertors. Because the inverters are components that are separately powered and will conduct current even if the coupling elements provide a separate path through the adjacent signal path, a coupling element provides isolation (described in FIG. 10) and a different test sequence (described in FIG. 11) are employed.

Turning now to FIG. 10, a circuit diagram shows a switching element within and between two signal paths according to an embodiment of the present invention. In particular, complementary pairs of p-channel and n-channel transistors are coupled to provide paths either from a component 930 of the first signal path 202F to a component 922 of the second signal path 202E, or from component 920 to component 922 within a signal path. Similarly, switching element 902B is used to provide paths from a component 920 of a second signal path to a component 932 of the first signal path, or from component 930 to component 932 within a signal path. Accordingly, the switching element enables passing a signal on the same signal path, or switching the signal from one signal path to the other signal path, regardless of whether the signal is received by the switching element from signal path 202E or signal path 202F.

The coupling element 902B is adapted to receive an input B1 or an inverted input /B1. The drains and sources of each of the transistor pairs are coupled together and to one of the signal paths 202E or 202F. In particular, the drains of transistor pair 1002 and 1004 and transistor pair 1006 and 1008 are coupled to component 920 by way of signal path 202E. Similarly, the drains of transistor pair 1010 and 1012 and transistor pair 1014 and 1016 are coupled to component 930 by way of signal path 202F. The sources of transistor pair 1002 and 1004 and transistor pair 1010 and 1012 are coupled to component 922 by way of signal path 202E, while the sources of transistor pair 1006 and 1008 and transistor pair 1014 and 1016 are coupled to component 932 by way of signal path 202F.

The gates of the transistor are controlled by a control signal and an inverted control signal, such as B1 or /B1. In particular, a first control signal B1 controls the gates of transistors 1002, 1008, 1012 and 1014, while the inverted control signal /B1 controls the gates of transistors 1004, 1006, 1010, and 1016. The switching of the various transistors enables coupling current from one signal path to the other (e.g. from signal path 202F to 202E), while preventing current in a component from being coupled to an adjacent component (e.g. from component 930 to component 932). As can be seen, when B1 is pulled high and /B1 is pulled low, a path is provided between component 930 and component 922. However, any path from component 920 to component 922 or from component 930 to component 932 is eliminated. That is, because the inverters are separately powered, it is necessary to block the path between adjacent components of a signal path when the switch is used to couple adjacent signal paths. Similarly, the conduction of current from component 920 to component 932 is enabled by pulling B1 low and /B1 high.

Figure 11A:
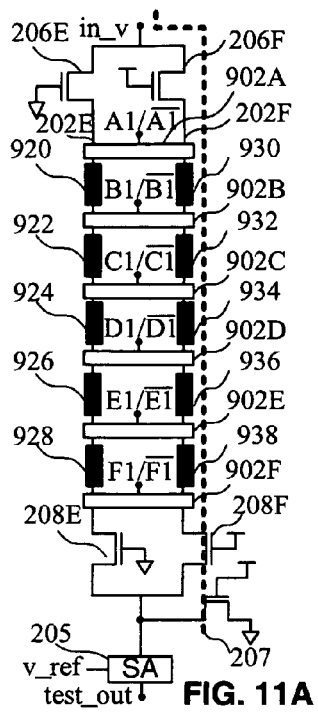
FIGS. 11A-F have a switching sequence showing the detection of a location of a defective component formed in a substrate by employing the circuit of FIG. 9 according to an embodiment of the present invention.

Turning now to FIGS. 11A-F, a switching sequence shows the detection of a location of defective component formed in a substrate by employing the circuit of FIG. 9. In particular, the transistors for selecting a signal path are set to couple the input signal through all of the components of a first signal path (i.e. signal path 202F) of the pair of signal paths to determine whether there are any defects in the first signal path, as shown in FIG. 11A. Accordingly, transistor 206F and 208F are turned on, while transistor 202E and 208E are turned off. Initially, all of the coupling elements 902A-902F coupling the signal paths 202E and 202F are turned off.

Figure 11B:
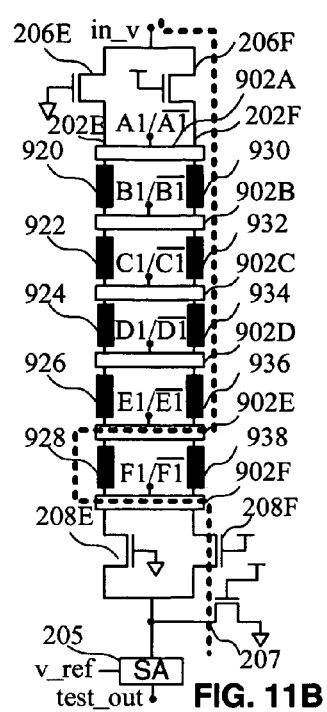
Figure 11C:
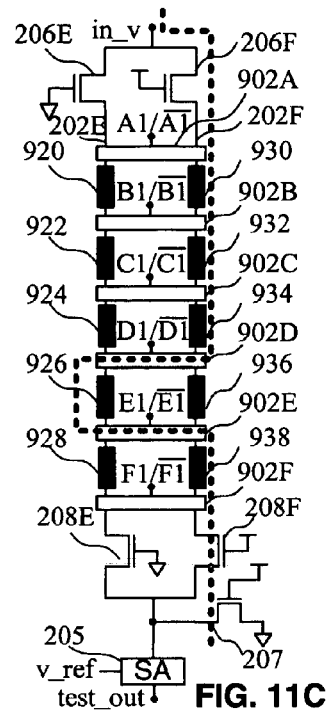
Figure 11D:
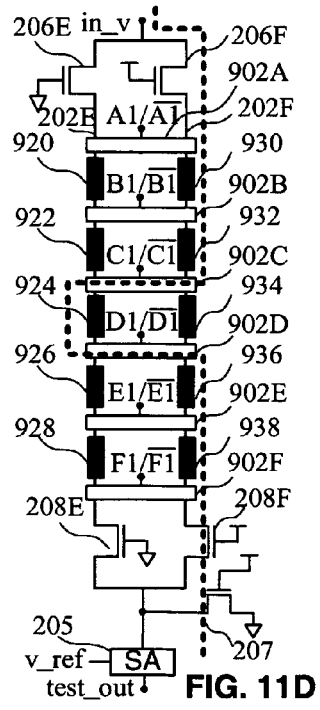
Figure 11E:
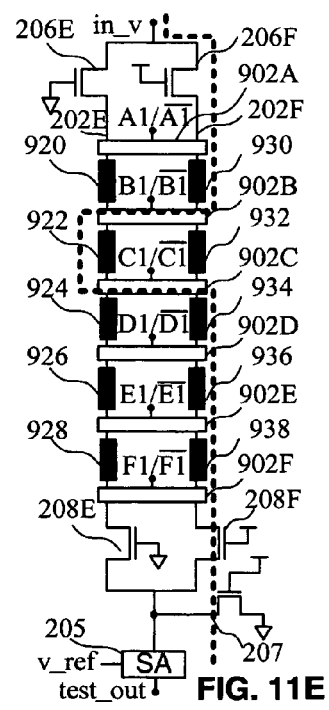
Figure 11F:
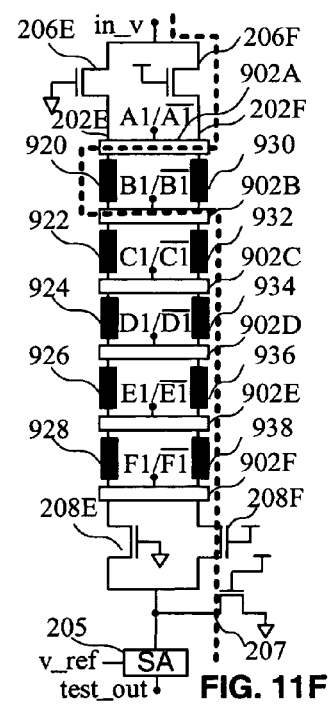

Control signals E1 and /E1 and F1 and /F1 are selected as described in reference to FIG. 10 to incorporate component 928 into the path, while isolating component 938, as shown in FIG. 11B. If the detector 205 detects the expected signal, it is determined that component 928 is not the defective component, but rather some other component coupled in signal path 206E is defective. As can be seen in the remaining FIGS. 11C-11F, pairs of coupling elements are selectively turned on to couple a different component in the path from the input to the detection circuit to determine whether the new component is the defective component. The switching of the coupling elements continues until the defective component is identified.

Turning now to FIG. 12, a flow chart shows a method of detecting a defect in a component of a signal path coupling a plurality of components formed in a substrate. The method of FIG. 12 could be implemented according to the circuits of FIGS. 1-11, or some other suitable circuit. In particular, a plurality of components is formed in a substrate at a step 1202. The components could be any a group of transistors such as a column or row of transistors associated with a memory device of an integrated circuit. The plurality of components formed in the substrate is coupled by way of a plurality of conductor segments of signal paths at a step 1204. The conductors could be conductive lines formed in any layer of an integrated circuit. That is, each signal path could comprise a plurality of conductor segments, wherein one conductor segment is coupled to a first end or input of the component and a second conductor segment is coupled to a second end or output of the component. An input signal is applied to a first end of a signal path at a step 1206. An output is the detected at a second end of the signal path at a step 1208. It is then determined whether a defect exists in a component of the plurality of components of the signal path formed in the substrate at a step 1210. It is then determined whether all of the signal paths have been tested at a step 1212. If not, an input signal is applied to another signal path at step 1206.

Turning now to FIG. 13, a flow chart shows a method of detecting the location of defect in a component of a signal path coupling a plurality of components formed in a substrate. A plurality of components is formed in a substrate at a step 1302. A pair of signal paths is provided at a step 1304, wherein each signal path couples in series a plurality of components formed in the substrate by conductor segments formed on the substrate. A plurality of switches is provided between the pair of signal paths at a step 1306. Depending upon the component formed in the substrate, the switches could comprise a single transistor, or a circuit for providing isolation as described for example in reference to FIG. 10. The testing of the first signal path of the pair of signal paths, as described for example in reference to FIG. 8 or 11, is then enabled at a step 1308. A signal is coupled to a first end of the pair of signal paths at a step 1310. It is then determined whether a first signal path of the pair of signal paths includes any defects at a step 1312. If a defect is detected, the signal path having a defect is stored at a step 1314.

If no defect is found in the first signal path, the plurality of coupling elements between the pair of signal paths is reconfigured at a step 1316 to identify the location of a defective component. In particular, a selected component is incorporated in series with known good components at a step 1318. It is then determined whether a defect in a component is detected at a step 1320. If so, the location of a defect in a component of the second signal path of the pair of signal paths is determined at a step 1322. Finally, it is determined whether all of the switches have been opened at a step 1324. If not, the plurality of switches is again reconfigured at the step 1316. Accordingly, the location of the defective component is determined.

Figure 14:
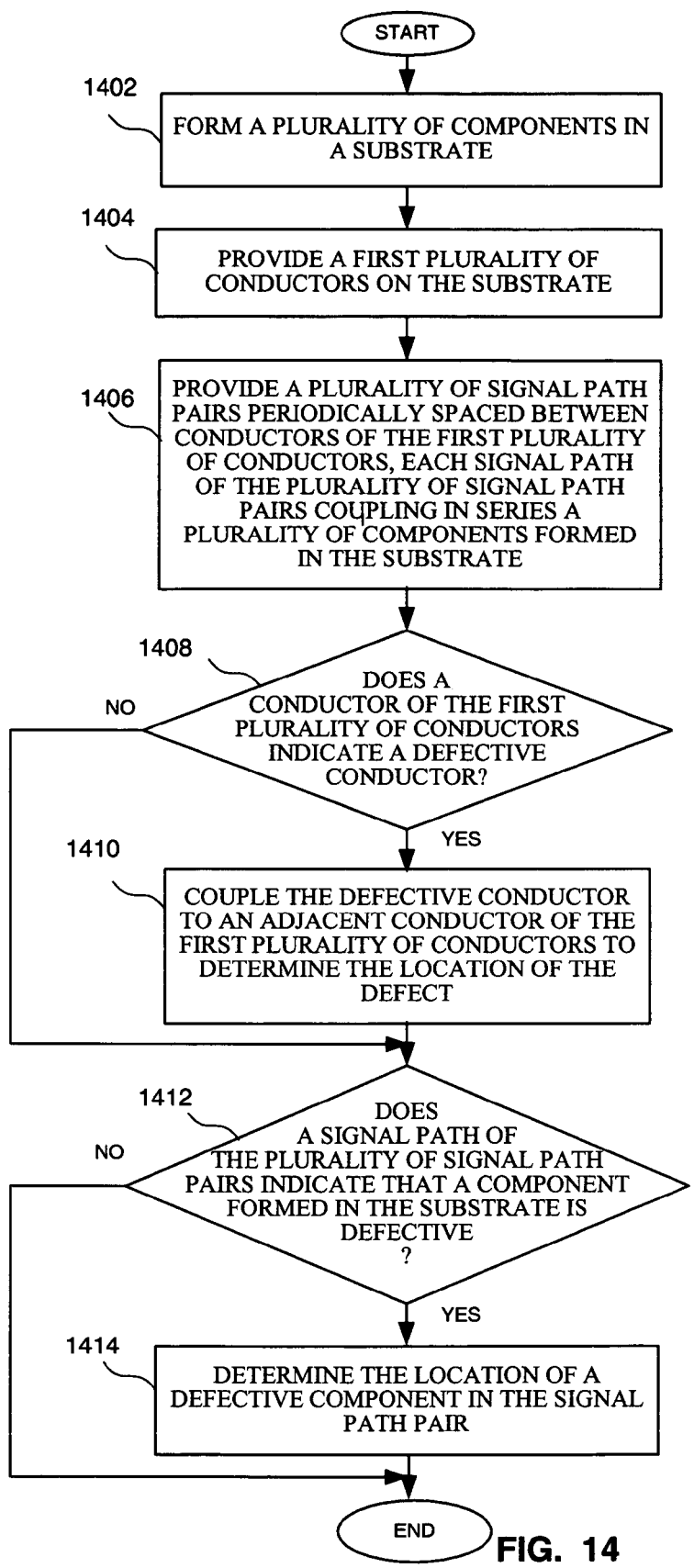
FIG. 14 is a flow chart showing a method of detecting defects in both a conductor formed on a substrate and a component formed in the substrate according to an embodiment the present invention.

Turning now to FIG. 14, a flow chart shows a method of detecting both defects in a conductor and a component formed in a substrate according to an embodiment the present invention. A plurality of components is formed in a substrate at a step 1402. A first plurality of conductors is provided on the substrate at a step 1404. A plurality of signal path pairs is periodically spaced between conductors of the first plurality of conductors at a step 1406, wherein each signal path of the plurality of signal path pairs couples in series a plurality of components formed in the substrate. It is then determined whether a conductor of the first plurality of conductors is a defective conductor at a step 1408. The defective conductor is coupled to an adjacent conductor of the first plurality of conductors to determine the location of the defect at a step 1410. It is then determined whether a signal path of the plurality of signal path pairs indicates that a component formed in the substrate is defective at a step 1412. The signal path having the defective component is coupled to the other signal path of the signal path pair, and the location of a defective component in the signal path pair is determined at a step 1414, as described above in reference to FIG. 13.

The circuits and methods of the present invention enable detecting defects in components formed in a substrate of an integrated circuit, and could be used on any portion of a die or wafer. For example, the circuits of the present invention could cover an entire wafer having a plurality of die, or any part of the wafer, including within individual die or between die in a scribe line. Further, each die could include a circuit portion (such as a programmable logic device), a test circuit in accordance with the embodiments of the present invention, and other test structures. Once the yield reaches an acceptable level, the manufacturer could selectively replace the test structures with other circuits, as desired. Alternatively, if the user determines that more area is required for test structures to increase the probability of detecting defects, the entire die could be replaced by a test die comprising larger test structures.

It can therefore be appreciated that the new and novel circuit and method of detecting a defect formed in a substrate has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A circuit for detecting a defect in a component formed in a substrate of an integrated circuit, said circuit comprising:
   a first signal path coupling in series a first plurality of components formed in said substrate;
   a second signal path, adjacent to said first signal path, coupling in series a second plurality of components formed in said substrate; and
   a plurality of switches coupled between said first signal path and said second signal path;
   wherein said plurality of switches enable a path from said first end of said first signal path to said detection circuit by way of said first signal path and said second signal path.

2. The circuit of claim 1 further comprising a first switching network for coupling an input signal to said first end of said first signal path.

3. The circuit of claim 2 further comprising a second switching network for coupling said second end of said first signal path to a detection circuit.

4. The circuit of claim 3 wherein said detection circuit comprises a sense amplifier.

5. A circuit for detecting a defect in a component formed in a substrate of an integrated circuit, said circuit comprising:
   means for coupling in series a plurality of components formed in said substrate;
   means for determining a defective signal path of a plurality of signal paths;
   means for coupling an adjacent signal path to said defective signal path; and
   means for determining the location of a defective component in said defective signal path.

6. The circuit of claim 5 further comprising means for coupling an input signal to a selected signal path of said plurality of signal paths.

7. The circuit of claim 6 further comprising means for coupling said selected signal path to a detection circuit.

8. The circuit of claim 7 further comprising means for determining if said adjacent signal path has a defective component.

9. A method of detecting a defect in a component formed in a substrate of an integrated circuit, said method comprising the steps of:
   coupling a plurality of components formed in said substrate by way of a plurality of signal paths;
   applying an input signal to a first end of a selected signal path;
   detecting an output at a second end of said selected signal path;
   determining whether a defect exists in a component of said selected signal path;
   coupling a first signal path to a second signal path by way of a plurality of coupling elements; and determining the location of a defect in said first signal path by sequentially switching said plurality of coupling elements to modify the path from said first end of said first signal path to a detection circuit.

10. The method of claim 9 further comprising a step of providing a plurality of conductors formed on said substrate.

11. The method of claim 9 further comprising a step of sequentially selecting a signal path of said plurality of signal paths coupling a plurality of components formed in said substrate.

12. A method of detecting a defect in a component formed in a substrate of an integrated circuit, said method comprising the steps of:
- providing a plurality of signal paths, each said signal path coupling in series a plurality of components formed in said substrate;
- determining a defective signal path of said plurality of signal paths;
- coupling an adjacent signal path to said defective signal path; and
- determining the location of a defective component in said defective signal path.

13. The method of claim 12 wherein said step of providing a plurality of signal paths comprises a step of providing a plurality of parallel signal paths.

14. The method of claim 12 wherein said step of determining the location of a defective component in said defective signal path comprises a step of determining the location of a defective transistor of a memory array.

15. The method of claim 12 wherein said step of determining the location of a defective signal path comprises a step of determining a defective row of a memory array.

16. The method of claim 15 further comprising a step of determining the location of a defective transistor in said defective row of said memory array.

17. A method of detecting a defect in a component formed in a substrate of an integrated circuit, said method comprising the steps of:
- providing a pair of signal paths, each said signal path coupling in series a plurality of components formed in said substrate;
- providing a plurality of switches between said pair of signal paths;
- selectively switching said plurality of switches to modify a path from a first end of said pair of signal paths to a second end of said pair of signal paths; and
- determining the location of said defect in a signal path of said pair of signal paths.

18. The method of claim 17 wherein said step of providing a pair of signal paths comprises a step of coupling adjacent signal paths by a plurality of switches.

19. The method of claim 18 further comprising a step of interleaving a plurality of conductors formed on said substrate between pairs of adjacent signal paths.

20. The method of claim 17 further comprising a step of determining that each component in a signal path of said pair of signal paths is functioning properly.

21. The method of claim 20 wherein said step of determining the location of said defect in said signal path of said pair of signal paths comprises a step of determining a defect in a signal path coupled to an adjacent signal path wherein each component of said adjacent signal path is functioning properly.

* * * * *